United States Patent [19]
Nakajima

[11] Patent Number: 5,998,797
[45] Date of Patent: Dec. 7, 1999

[54] MASK FOR ELECTRON BEAM EXPOSURE AND ELECTRON BEAM DRAWING METHOD

[75] Inventor: Ken Nakajima, Tokyo, Japan

[73] Assignee: NEC Corporation, Tokyo, Japan

[21] Appl. No.: 09/060,078

[22] Filed: Apr. 15, 1998

[30] Foreign Application Priority Data

Apr. 15, 1997 [JP] Japan ..................................... 9-097537

[51] Int. Cl.$^6$ .............................. H01J 37/00; G21K 5/10
[52] U.S. Cl. ................... 250/492.2; 250/492.22; 250/492.23
[58] Field of Search ........................... 250/492.2, 492.22, 250/492.23, 492.24

[56] References Cited

FOREIGN PATENT DOCUMENTS 4271112  9/1992  Japan .
5299328  11/1993  Japan .

Primary Examiner—Edward P. Westin
Assistant Examiner—Milita Wells
Attorney, Agent, or Firm—Foley & Lardner

[57] ABSTRACT

A mask for electron beam exposure has a plurality of holes for drawing contact. These holes have a plurality of sizes that correspond to regions which should be drawn by an electron beam. Among the plurality of holes for drawing contact, one hole is selected according to the designed size. Then, the mask for electron beam exposure is located on the resist film so that the selected hole for drawing contact may be positioned on the contact formation predetermined area of the wafer. Next, the electron beam is applied to the resist film on the contact formation predetermined area of the wafer through the selected hole by irradiating the electron beam from the upper side of the mask. Consequently, the contact pattern is exposed to the resist film.

19 Claims, 5 Drawing Sheets

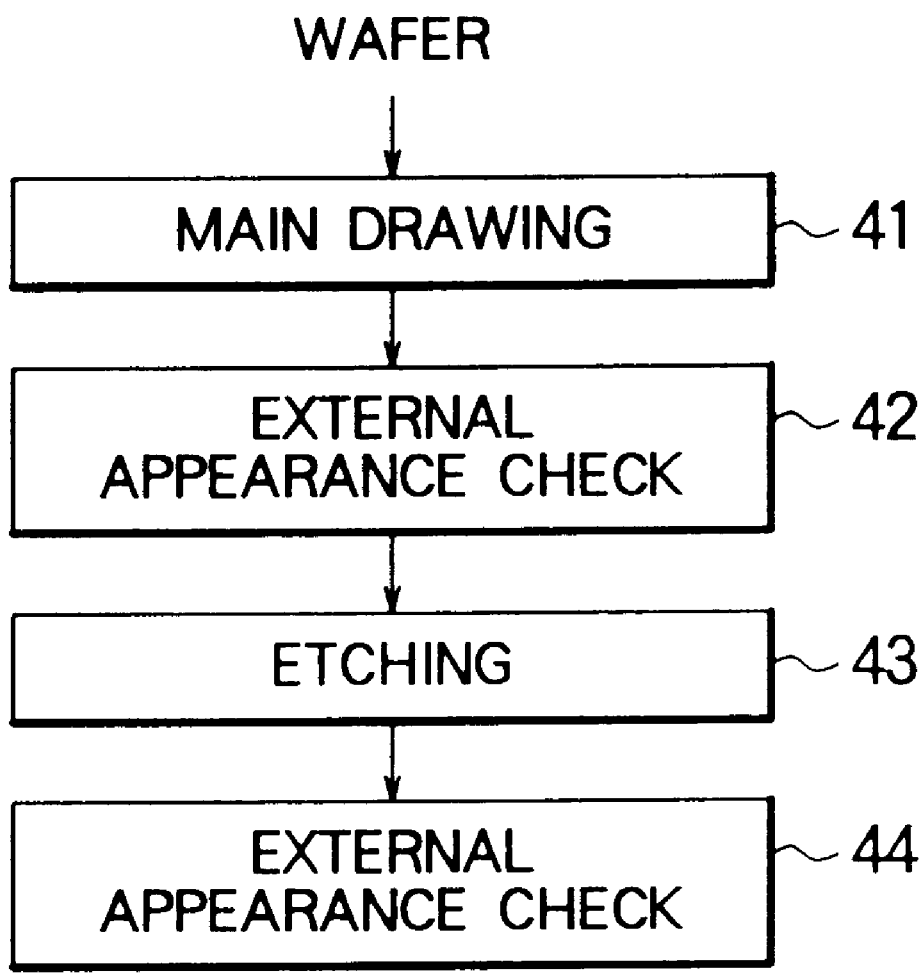

MASK FOR ELECTRON BEAM EXPOSURE AND ELECTRON BEAM DRAWING METHOD

BACKGROUND OF THE INVENTION

1. Field of the Invention

The present invention relates to a mask for electron beam exposure which exposes a desired pattern on a resist film by using an electron beam, and an electron beam drawing method using the mask for electron beam exposure.

2. Description of the Related Art

In manufacturing of a semiconductor device, it is required to develop a manufacturing method by which a high through-put can be obtained. In the lithography process, in the case of forming a fine pattern on a semiconductor wafer, recently, various types of techniques to raise the through-put are also proposed. An example may be found not only in optical lithography by ultra violet light, and X-ray lithography by X-ray, but also in electron beam lithography by an electron beam. These examples utilize a transfer method using a mask for electron beam exposure. This mask for electron beam exposure has a hole of a desired pattern which has previously been formed similar to the optical or the X-ray mask and reticle.

The drawing method using a mask for electron beam exposure is generally utilized in the manufacturing of memory devices such as a DRAM (Dynamic Random Access Memory) and an SRAM (Static Random Access Memory) which have a lot of repeating patterns. On the other hand, when manufacturing logic devices such as an ASIC (Application Specific Integrated Circuit) and a micro computer which have relatively few repeating patterns, the conventional exposure by a variable shaped electron beam is applied.

FIGS. 1A to 1C are schematic views showing the conventional drawing method using a variable shaped electron beam. It should be noted that, as shown in FIG. 1A, in a variable shaped electron beam, the maximum area capable of being drawn in a single exposure, i.e., by a shot at one time, is limited, and this maximum area is made to be the maximum irradiated area 17. As shown in FIG. 1B, in a case where the desired pattern 15 is larger than the maximum irradiated area 17, then first, in order to divide the desired pattern 15 into rectangular areas smaller than the maximum irradiated area 17, rectangular division lines 16 are designed. Then, as shown in FIG. 1C, after the desired pattern 15 has been divided into rectangular patterns 18, 19, 20, and 21, the electron beam irradiation areas are matched to the rectangular patterns 18, 19, 20 and 21 by using two pieces of apertures, and the electron beam is applied to a specified area of the resist film for each rectangular pattern 18–21. Consequently, a desired pattern 15 is exposed on the resist film.

In the case where the exposure is performed by the variable shaped electron beam, it is necessary to adjust the size of the variable shaped (rectangular) electron beam in advance. The reason is that the external environment of the electron beam lowers the formation deflection of the electron beam and the electron beam exposure device, and, the stability and the repeatability of the formation lens, the object lens and the like. That is, the optical system of the electron beam and the electron beam exposure device are made to be unstable by unstable factors. Exemplary factors include the ambient temperature of the electron beam, the vibration, the magnetic field, the high voltage power supply for accelerating voltage, and the line noise or the like produced between the power source of the device and the component unit of the device. Consequently, the required dimensional accuracy cannot be obtained, and especially, dimensional variations at the exposure area in the resist film occur.

Furthermore, since the dimensional stability of the irradiation area of the electron beam is lowered with the elapse of time, usually, it is necessary to perform adjustment after every 10 to 12 hour period. Moreover, if a high dimensional accuracy is kept by adjusting the size for every device that different in design size, the desired pattern can be exposed in a stable state.

The process to pattern the resist film to the desired shape by lithography using the variable shaped electron beam will be specifically described below. FIG. 2 is a flow chart showing the conventional patterning method of the resist film using the variable shaped electron beam. In a case where the resist film formed on the surface of a wafer is patterned, then for step 31 the electron beam drawing device is adjusted in advance. At this time, the size of the irradiated area where the electron beam is applied is adjusted so that the variable shaped (rectangular) electron beam may be applied to the resist film in a specific size. Next, for step 32, a pilot drawing is performed to extract the condition of the best exposure amount for obtaining the resist pattern of a desired size. It is necessary to determine the condition of the best exposure amount, considering the difference between the design size and the size of the resist film, obtained by the etching process after the lithography process.

Furthermore, at this step 32, the alignment condition may be selected for performing the overlapping exposure to the backing film previously patterned on the desired shape. However, commonly, since the exposure can be performed by the size and the position (coordinate) of a previously determined pattern, it is not always necessary to perform this selection of the alignment condition.

Next, for step 33, by using the best exposure amount selected by the pilot drawing result of step 32, the main drawing is performed to all wafers of 1 lot, and the development is performed to pattern the resist film. After that, for step 34, the external appearance check is performed for inspecting a drawing fault, the rubbish, or the like. After that, for step 35, the backing film is etched using the resist film patterned on a specified shape as the mask. After that, as the step 36, the external appearance check is further performed, and then, the process advances to the next process.

Thus, in the conventional electron beam lithography process using the variable shaped electron beam, the steps 31 to 36 are performed for every product lot that is different in design size.

However, in the conventional process of the electron beam lithography by the variable shaped electron beam, applied at the time of the formation of the circuit of a logic device, the process (step 31) to adjust the size of the irradiated area of the variable shaped electron beam, and the process (step 32) to select the condition of the best exposure amount for obtaining a desired resist pattern size by the pilot drawing, are necessary for every product lot that is different in design size.

Furthermore, in the conventional process of the electron beam lithography, since it is necessary to consider the difference between the design size and the size of the resist film obtained by the etching process, the work to select the best condition of the exposure for every wafer becomes necessary, if the design size, and the material, structure, thickness and the like of the backing film are different.

Accordingly, there is such a problem that the time necessary for the process of the electron beam lithography (TAT, i.e., turn around time) extends for several hours.

Furthermore, the irradiated area of the variable shaped electron beam may be changed by the adjusting method of two pieces of apertures and the fluctuation of the voltage of the formation lens or the like, and consequently, there is such a problem that the dimensional accuracy of the resist pattern is lowered, too. Especially, when drawing the contact pattern, the rectangular pattern designed by a fine rule is drawn by the variable shaped electron beam, and therefore, the dimensional accuracy of the obtained resist pattern is extremely degraded.

Recently, accompanied with the tendency to increase the kinds and to decrease the quantity of production of the logic devices, the reduction of the term of production (reduction of TAT) is required. Therefore, it is studied to reduce the processing steps preventing the reduction of TAT. Furthermore, accompanied with the tendency towards high integration and fineness of the devices, especially, in the contact drawing process using the minimum design rule, it is necessary to perform the drawing in such a way that the dimensional accuracy may be within ±10% relative to the design size, that is, not more than 0.03 $\mu$m. Accordingly, when the variable shaped electron beam that contributes to the degradation of the dimensional accuracy is used, it becomes an important subject to improve the deficiency of the drawing accuracy.

SUMMARY OF THE INVENTION

An object of the present invention is to provide a mask for electron beam exposure and an electron beam drawing method by which the fluctuation of the size of the drawing area by the electron beam can be restrained, the exposure can be performed stably by a desired size, and the time necessary for the process of the electron beam lithography can be reduced.

The mask for electron beam exposure according to the present invention has a plurality of holes for drawing contact. The holes have a plurality of sizes that correspond to regions which should be drawn by an electron beam.

These plurality of holes for drawing contact can be smaller than a maximum area irradiated by the electron beam at one time, and in this maximum area, one or more, i.e., at least one, holes for drawing contact can be provided. The mask for electron beam exposure according to the present invention may have a main body portion having the holes for drawing contact, and a leg portion supporting the main body portion. Moreover, the mask for electron beam exposure may have a hole for a variable shaped electron beam having a size equal to or larger than that of a maximum area irradiated by the electron beam in a single exposure, i.e., at one time.

The electron beam drawing method according to the present invention comprises the step of setting the mask for an electron beam exposure on the wafer, and the step of irradiating the electron beam from the upper side of the mask to expose the drawing predetermined area on the wafer by the electron beam through the holes for drawing contact. The mask has a plurality of holes for drawing contact and the holes have a plurality of sizes that correspond to regions which should be drawn by an electron beam.

One or more holes for drawing contact can be selected among the plurality of holes for drawing contact in accordance with the regions.

In the present invention, the determined area on the wafer is drawn by electron beam irradiation through the holes for drawing contact previously provided in the mask for electron beam exposure. Accordingly, the exposure area obtained by this step is not affected by the adjusting of the aperture forming the rectangular electron beam, or the fluctuation of the lens forming the variable shaped electron beam and the like, and the fluctuation of the drawing size can be restrained to a minimum. Consequently, the exposure area of a desired size can stably be obtained.

Furthermore, in the present invention, because the conventional dimensional adjustment process of the irradiation area of the electron beam and the conventional pilot drawing process can be omitted, the time (TAT) necessary for the lithography process by the electron beam can be reduced.

BRIEF DESCRIPTION OF THE DRAWINGS

FIG. 4 is a flow chart showing the lithography process using the mask for electron beam exposure according to the first embodiment of the present invention.

DETAILED DESCRIPTION OF THE PREFERRED EMBODIMENTS

Figure 1A:
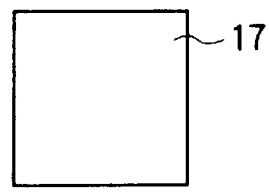
FIGS. 1A to 1C are schematic views showing the conventional drawing method using the variable shaped electron beam.
Figure 1B:
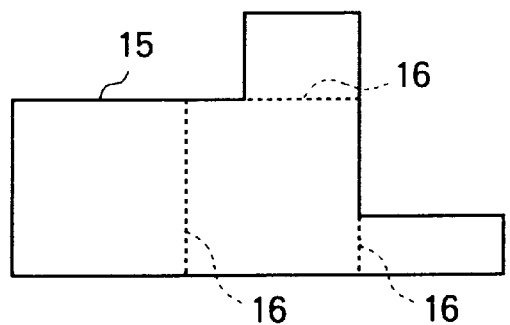
Figure 1C:
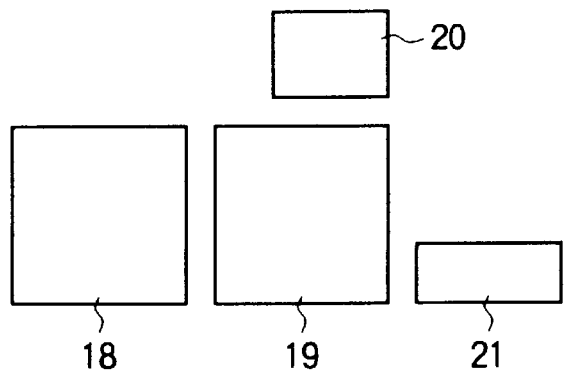
Figure 2:
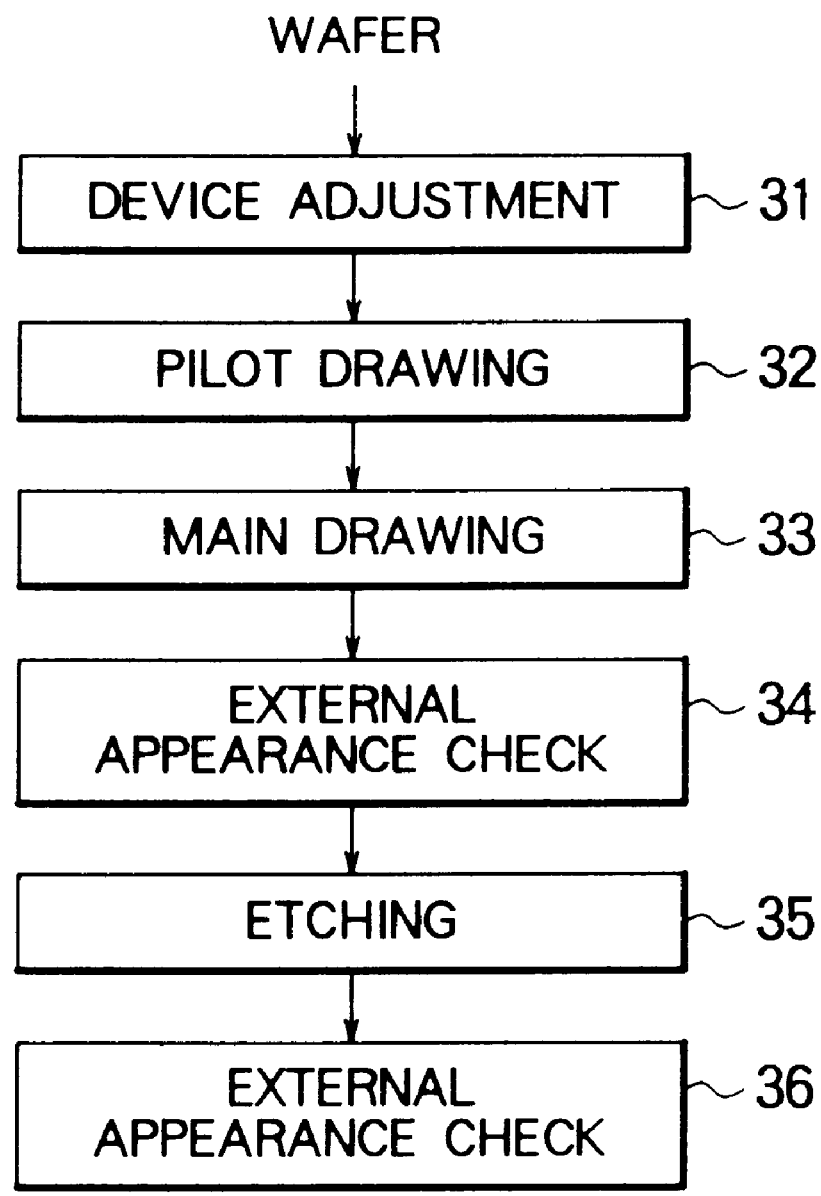
FIG. 2 is a flow chart showing the conventional patterning method of the resist film using the variable shaped electron beam.
Figure 3A:
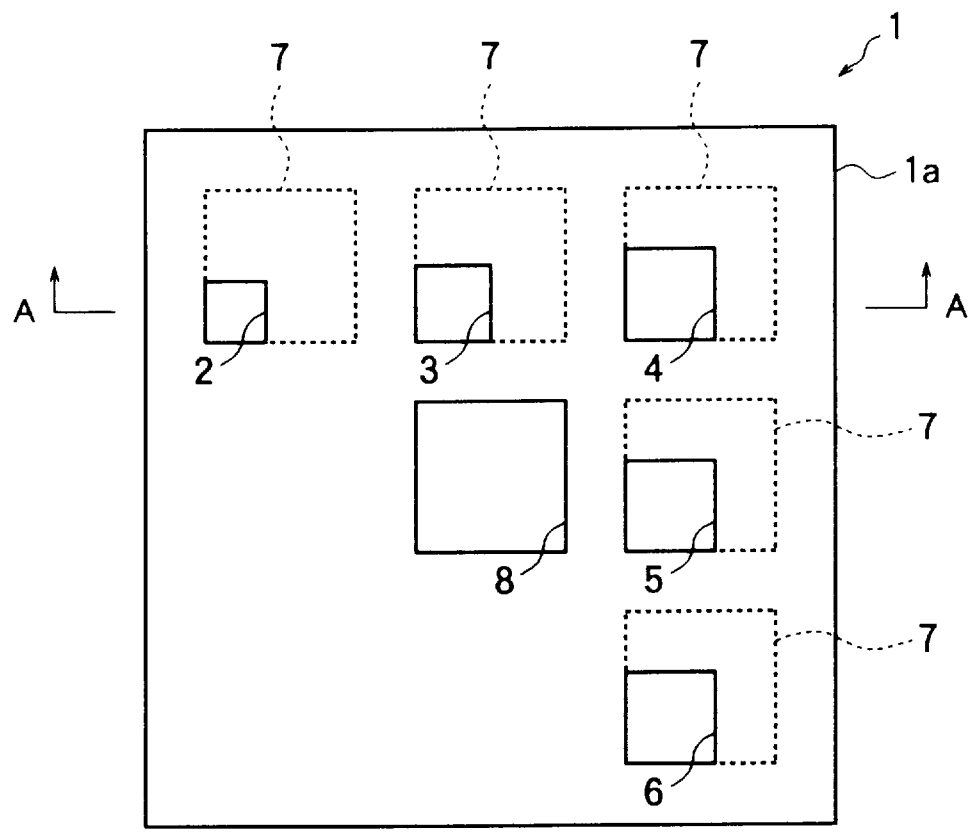
FIG. 3A is a plan view showing the mask for electron beam exposure according to a first embodiment of the present invention.
Figure 3B:
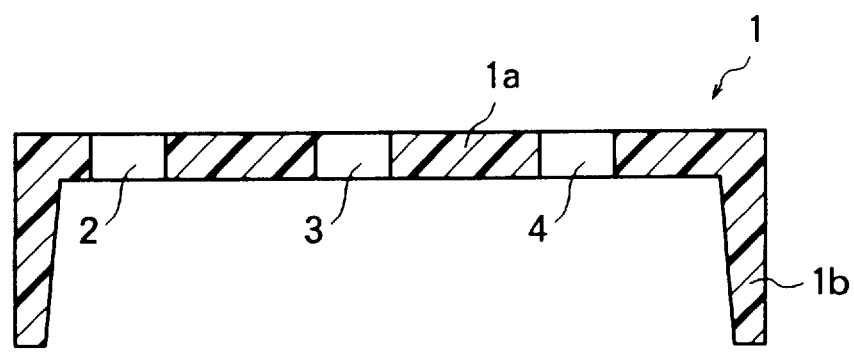
FIG. 3B is a cross-sectional view along the line A—A in FIG. 3A.

The embodiments of the present invention will specifically be described below by referring to the accompanying drawings. FIG. 3A is a plan view showing the mask for electron beam exposure according to a first embodiment of the present invention, and FIG. 3B is a cross-sectional view along the line A—A in FIG. 3A. As shown in FIGS. 3A and 3B, the mask 1 for electron beam exposure has a rectangular flat portion 1a, and a leg portion 1b extending downward from the periphery of the flat portion 1a.

It should be noted that, the mask 1 for electron beam exposure according to the present embodiment is to expose, i.e., draw, one contact pattern of a desired size by an electron beam irradiation in a single exposure, i.e., a shot of one time. Accordingly, the flat portion 1a is divided into a plurality of areas 7 having the same shape and size as the maximum irradiated area of the electron beam which can be drawn by a shot of one time. Then, in these areas 7, holes 2, 3, 4, 5, and 6 for drawing contact with different sizes are provided, respectively. Furthermore, in the center of the flat portion 1a of the mask 1 for electron beam exposure, a hole 8 for a variable shaped electron beam is provided.

The process of the electron beam lithography to draw a desired pattern by using the mask 1 for an electron beam exposure in this construction technique, will be specifically described below. FIG. 4 is a flow chart showing the lithography process using the mask for electron beam exposure according to a first embodiment of the present invention.

As shown in FIGS. 3–4, in the present embodiment, it is not necessary to perform the dimensional adjustment of the electron beam and the pilot drawing. That is, for step 41 of FIG. 4, choosing from among the holes 2, 3, 4, 5, and 6 of FIG. 3 previously provided in the mask 1 for electron beam exposure, for example, hole 4 is selected according to the desired contact size designed for each product. Then, the mask 1 for electron beam exposure is positioned on the resist film so that the hole 4 may be located on the contact formation predetermined area of the wafer. Next, by irradiating the electron beam to the area 7 from the upper side of the mask 1, the electron beam is applied onto the resist film on the contact formation predetermined area of the wafer through the hole 4. Thus, all contact patterns are drawn to the resist film with this technique.

Next, for step 42, the check of the external appearance is performed for the inspection of the drawing fault, the rubbish or the like. After that, for step 43, the backing film is etched by using the resist film patterned to the desired shape as the mask. After that, for step 44, the check of the external appearance is further performed, and then, the process advances to the next process.

Thus, in the present embodiment, by using the holes 2, 3, 4, 5, and 6 previously provided in the mask 1 for electron beam exposure, the contact pattern is drawn. Accordingly, the irradiated area of the electron beam is not affected by the adjustment of the aperture forming the rectangular electron beam, or the fluctuation of the lens forming the variable shaped electron beam and the like. Consequently, the exposure area by the electron beam can stably be obtained with a desired size, and the variation of the size of the obtained contact pattern can be restrained to a minimum.

Furthermore, in the present embodiment, since the conventional process of the dimensional adjustment of the irradiated area of the electron beam and the conventional pilot drawing process can be omitted, the time (TAT) necessary for the lithography process by the electron beam can be reduced.

It should be noted that, in a case where the desired exposure area is not adapted to the holes 2, 3, 4, 5, and 6, the resist film can be exposed with a desired shape and size, by using the variable shaped electron beam through the hole 8.

Figure 5A:
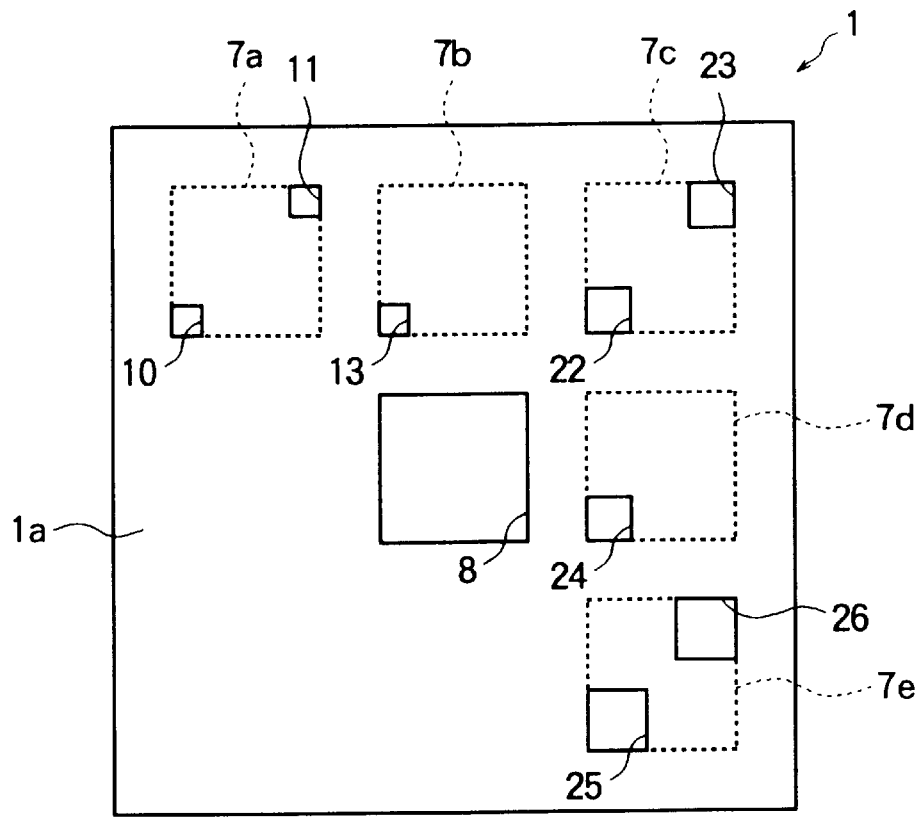
FIG. 5A is a plan view showing the mask for electron beam exposure according to a second embodiment of the present invention.
Figure 5B:
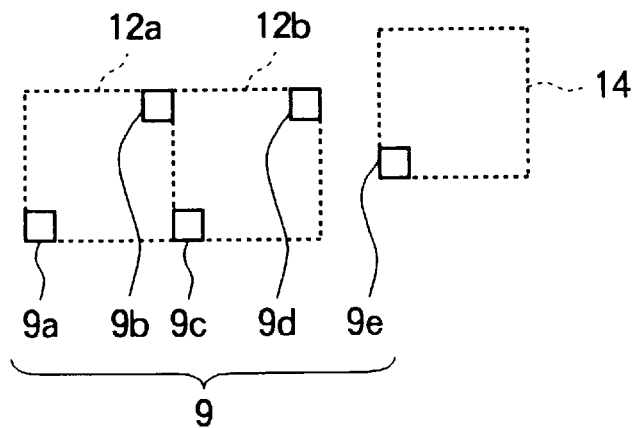
FIG. 5B is a schematic view showing a desired contact pattern.

FIG. 5A is a plan view showing the mask for electron beam exposure according to a second embodiment of the present invention, and FIG. 5B is a schematic view showing the desired contact pattern. In the second embodiment as shown in FIG. 5A, the same reference numerals are given to the same parts, i.e., elements, as those of the first embodiment shown in FIG. 3, and the detailed description thereof will thus be omitted.

As shown in FIG. 5A, the mask for electron beam exposure according to the second embodiment is arranged to be able to draw two contact patterns of a desired size by the irradiation of the electron beam for one exposure, i.e., of one time. That is, similar to the first embodiment, the flat portion 1a is divided into a plurality of areas 7a, 7b, 7c, 7d, and 7e having the same shape and size as the maximum irradiated area of the electron beam. Then, in the area 7a, two holes 10 and 11 for drawing contact are provided. Furthermore, in another area 7b, one hole 13, for drawing contact, that has the same size as the holes 10 and 11, is provided. Similarly, in the area 7c, two holes 22 and 23 for drawing contact that have a size different from that of the holes 10, 11, and 13 are provided. Furthermore, in the area 7d, one hole 24 for drawing contact that has the same size as the holes 22 and 23 is provided. Furthermore, in the other area 7e, two holes 25 and 26 for drawing contact that have a size different from that of the holes 10, 11, 13, 22, 23, and 24, are provided.

It should be noted that, in a case where two holes for drawing contact are provided in one area, the relative position, the distance and the like between these two holes are designed on the basis of the relative position and the distance between the desired contact patterns that has been previously determined at the time of the design of the semiconductor device.

The process of the electron beam lithography drawing the desired pattern by using the mask 1 for an electron beam exposure in this construction technique, will specifically be described below. As shown in FIG. 5B, for example, in a case where the desired contact patterns 9a and 9b, and the contact patterns 9c and 9d coincide with the holes 10 and 11 respectively, first, the mask 1 for electron beam exposure is located on the resist film so that the holes 10 and 11 may be positioned on the contact formation predetermined area for forming the contact patterns 9a and 9b. At this time, the area 12a in the resist film and the area 7a in the mask 1 are in a conformable positional relation. Next, by irradiating the electron beam to the area 7a from the upper side of the mask 1, the electron beam is irradiated to the resist film on the contact formation predetermined area of the wafer through the holes 10 and 11. Consequently, the contact patterns 9a and 9b are drawn to the resist film.

After that, the mask 1 for electron beam exposure on the wafer is moved so that the holes 10 and 11 may be positioned on the contact formation predetermined areas for forming the contact patterns 9c and 9d. Consequently, the area 12b in the resist film and the area 7a in the mask 1 become in a conformable positional relation. After that, by irradiating the electron beam to the area 7a from the upper side of the mask 1, the electron beam is irradiated to the resist film on the contact formation predetermined area of the wafer through the holes 10 and 11. Consequently, the contact patterns 9c and 9b are drawn on the resist film.

It should be noted that, since the contact pattern 9e does not coincide with the holes 10 and 11, the hole 13 is used. That is, the mask 1 for electron beam exposure on the wafer is moved so that the hole 13 may be positioned on the contact formation predetermined area for forming the contact pattern 9e. Consequently, the area 14 in the resist film and the area 7b in the mask 1 become in a conformable positional relation. After that, by irradiating the electron beam to the area 7b from the upper side of the mask 1, the electron beam is irradiated to the resist film on the contact formation predetermined area of the wafer through the hole 13. Consequently, the contact pattern 9e is drawn on the resist film. Thus, desired contact patterns group 9 can be drawn to the resist film on the wafer by the electron beam.

After that, similarly to the first embodiment, the external appearance is checked for the inspection of the drawing fault, rubbish and the like. After that, the backing film is etched using the resist film patterned on a desired shape as the mask, and then, the check of the external appearance is further performed, and after that, the process advances to the next process.

Thus, in the second embodiment, and similar to the first embodiment, the dimensional accuracy of the obtained resist pattern is also improved. Furthermore, in the second embodiment, since the number of shots at the time of drawing the contact pattern can be reduced, the drawing time (TAT) by the electron beam can be reduced and the throughput can be improved.

What is claimed is:

1. A mask for an electron beam exposure comprising:
   a plurality of holes for exposing contacts, wherein
      said holes have a plurality of sizes that correspond to regions for drawing by an electron beam, and wherein said mask is set upon a wafer for said electron beam exposure.

2. A mask for electron beam exposure according to claim 1, wherein an area of each of said plurality of holes is smaller than a maximum area irradiated by said electron beam in a single exposure.

3. A mask for electron beam exposure according to claim 2, wherein at least one hole for exposing contacts is provided in said maximum area.

4. A mask for electron beam exposure according to claim 1, comprising:

a main body portion having said holes for exposing contacts; and a leg portion supporting said main body portion.

5. A mask for electron beam exposure according to claim 1, further comprising:

a hole for a variable shaped electron beam, said hole having an area at least as large as that of a maximum area irradiated by said electron beam in a single exposure.

6. A mask for electron beam exposure according to claim 5, comprising:

a main body portion having said holes for exposing contacts; and a leg portion supporting said main body portion.

7. A mask for electron beam exposure according to claim 6, wherein said hole for said variable shaped electron beam is provided in an approximate center of said main body portion.

8. An electron beam drawing method comprising the steps of:

setting a mask upon a wafer for an electron beam exposure, wherein said mask has a plurality of holes for exposing contacts, and wherein said holes have a plurality of sizes that correspond to regions to be exposed by an electron beam; and irradiating said regions of said wafer, by utilizing an electron beam, wherein said irradiation is provided from an upper side of said mask to expose said regions on said wafer by said electron beam through said holes for exposing contacts.

9. An electron beam drawing method according to claim 8, wherein said mask for electron beam exposure has at least one hole that is located in, and is smaller than, a maximum area that is irradiated with said electron beam in a single exposure.

10. An electron beam drawing method according to claim 8, wherein at least one hole is selected from among said plurality of holes in accordance with said regions.

11. An electron beam drawing method according to claim 10, wherein said mask for said electron beam exposure is set upon said wafer so that at least one of said selected holes for exposing contacts is positioned on a respective said region.

12. A mask for an electron beam exposure as recited in claim 1, wherein said mask further comprises a leg portion extending from a periphery of a flat portion of said mask.

13. A mask for an electron beam exposure as recited in claim 12, wherein said leg portion separates said mask flat portion from said wafer by a distance approximately equal to a length of said leg extension.

14. An electron beam drawing method as recited in claim 8, wherein said mask further comprises a leg portion extending from a periphery of a flat portion of said mask.

15. An electron beam drawing method as recited in claim 14, wherein said leg portion separates said mask flat portion from said wafer by a distance approximately equal to a length of said leg extension.

16. A mask for an electron beam exposure as recited in claim 1, wherein a resist film is between said wafer and said mask.

17. A mask for an electron beam exposure as recited in claim 16, wherein at least one area of said resist film and at least one area of said mask are in a respective conformable positional relation.

18. An electron beam drawing method as recited in claim 8, wherein a resist film is between said wafer and said mask.

19. An electron beam drawing method as recited in claim 18, wherein at least one area of said resist film and at least one area of said mask are in a respective conformable positional relation.

* * * * *